United States Patent [19]

Weber et al.

[11] Patent Number: 5,357,019
[45] Date of Patent: Oct. 18, 1994

[54] CARBOSILANE POLYMERS PREPARED FROM BUTADIENE

[76] Inventors: William P. Weber; Guo-Hong Wang, both of 3341 Country Club Dr., Los Angeles, Calif. 90019

[21] Appl. No.: 189,128

[22] Filed: Jan. 31, 1994

Related U.S. Application Data

[63] Continuation of Ser. No. 4,857, Jan. 15, 1993, abandoned.

[51] Int. Cl.$^5$ ............................................. C08G 77/08
[52] U.S. Cl. ........................................ 528/15; 528/12; 528/13; 528/14; 528/25; 526/279
[58] Field of Search ................... 528/12, 13, 14, 15, 528/25; 526/279

[56] References Cited

U.S. PATENT DOCUMENTS

| | | |
|---|---|---|
| 4,719,273 | 1/1988 | Seyferth et al. . |
| 5,130,390 | 7/1992 | Weber et al. ................... 526/279 |
| 5,153,295 | 10/1992 | Whitmarsh et al. . |
| 5,169,916 | 12/1992 | Weber et al. ................... 526/279 |
| 5,171,810 | 12/1992 | Weber et al. ................... 526/279 |

OTHER PUBLICATIONS

Fujita et al., J. Organometallic Chem. 113:201 (1976).
Richter, J. Organometallic Chem. 289:45 (1985).

*Primary Examiner*—Melvyn I. Marquis
*Attorney, Agent, or Firm*—Connolly & Hutz

[57] ABSTRACT

Polycarbosilane polymers are prepared from 1,3-butadiene or substituted 1,3-butadiene by reacting the butadiene with a dichlorosilane in the presence of a reducing metal. The polymers contain silicon hydride or other crosslinkable groups in the polymer chain.

12 Claims, No Drawings

CARBOSILANE POLYMERS PREPARED FROM BUTADIENE

Invention was made with Government assistance under Contract No. N00014-89-J-1961 by the Department of the Navy. The Government has certain rights in this invention.

This application is a continuation, of application Ser. No. 08/004,857 filed on Jan. 15, 1993 and now abandoned.

FIELD OF THE INVENTION

The invention relates to the field of crosslinkable organosilicon polymers, and more particularly to polycarbosilane polymers which can be crosslinked by hydrosilation.

BACKGROUND AND PRIOR ART

Various carbosilane polymers and their preparation are known in the art. For example, unsaturated carbosilane polymers are prepared by the ring-opening polymerization of silacyclopent-3-enes. See, for example, U.S. Pat. Nos. 5,171,810 and 5,169,916. It is also known that carbosilane polymers may be crosslinked by hydrosilation, as disclosed, for example, in U.S. Pat. 5,130,390 to Weber and Liao.

U.S. Pat. No. 4,719,273 to Seyferth et al. discloses preceramic polymers prepared by reacting bimetallic compounds of ethylene or acetylene with methyldichlorosilane.

Fujita et al., Journal of Organometallic Chemistry 113:201 (1976) disclose preparation of magnesium/butadiene addition compounds. The reaction of butadiene magnesium with diorganodichlorosilanes to produce diorganosilacyclopent-3-ene derivatives is disclosed in Richter, Journal of Organometallic Chemistry, 289:45 (1985).

SUMMARY OF THE INVENTION

Carbosilane polymers are prepared by reacting 1,3-butadiene or substituted 1,3-butadiene with dichlorosilanes in the presence of a reducing metal. The resulting carbosilane polymers contain both butadiene-derived units and silicon hydride radicals in the polymer chain, and are crosslinkable by reactions such as hydrosilation.

DESCRIPTION OF THE PREFERRED EMBODIMENTS

The polymers of the present invention are characterized by improved properties including dielectric constants and water absorbances in relation to existing materials such as crosslinked siloxanes. A low dielectric constant promotes signal integrity and speed of transmission when the materials are used for electronic devices, including printed circuit board laminating resins or encapsulating resins.

The butadiene reactant used to prepare the carbosilane polymers of the invention is 1,3-butadiene or one or more substituted butadienes, or mixtures thereof. Suitable substituted butadienes are preferably substituted at the 2-position with lower alkyl or halogen and include, for example, 2-methyl-1,3-butadiene, 2-chloro-1,3-butadiene, or 2-bromo-1,3-butadiene. The butadiene reactant can also be 1,4-dichloro-2-butene.

The dichlorosilane reactant is of the formula $RSiHCl_2$ wherein R is hydrogen, a lower alkyl, preferably $C_1$–$C_4$ alkyl, an aromatic radical, preferably phenyl, or a cycloalkyl radical, preferably cyclohexane. Methyldichlorosilane and phenyldichlorosilane are most preferred. As discussed below, disubstituted chlorosilanes may also be included in the reaction and are encompassed by the term "dichlorosilane reactant".

The reducing metal is an alkali metal or an alkaline earth metal, and is preferably magnesium metal or a sodium dispersion.

The reaction may be carried out using a number of different procedures. A suitable one-step procedure involves adding dichlorosilane and magnesium powder, together with a catalytic amount of a halogen catalyst such as iodine, iodomethane, or 1,2-dibromoethane in an organic solvent, for example tetrahydrofuran. Condensed, liquid butadiene reactant is added with reactor cooling to control the exothermic reaction. This procedure is useful for the preparation of polymers in which the ratio of $Si/C_4H_6$ is 1:1.

An alternative procedure to prepare 1:1 polymers on a large scale involves adding the 1,3-butadiene, magnesium and halogen catalyst in THF together. The dichlorosilane is added to this mixture slowly while controlling the reaction temperature between 30° and 40° C. A highly efficient reflux condenser cooled by a refrigeration unit is necessary.

A modified procedure is utilized to prepare polymer with a ratio from 1:1.2 to 1:3 $Si/C_4H_6$. These preparations are carried out by reacting 1,3-butadiene, magnesium and a halogen catalyst in THF until virtually all the magnesium has reacted. This may require 15 to 48 h at 20° C. to 70° C. The appropriate amount of dichlorosilane to achieve the desired composition $Si/C_4H_6$ of the polymer is then added at 0° C. Low temperature is essential to maintain Si-H bonds. The reaction is then heated, e.g. to about 50° C., for two hours after dichlorosilane addition is complete. The product solution from any of these procedures is filtered, quenched in saturated ammonium chloride, extracted in ether, washed, and dried using magnesium sulfate. The solvent, together with silacyclopentene monomer and dimer byproducts, are removed under reduced pressure to yield the crude polymer. The crude product is purified in a conventional manner, for example, by precipitation from methanol. Further process details are provided in the examples which follow.

The polymers prepared as described using dichlorosilane of the formula $RSiHCl_2$ contain repeating units of the following formulae I and II:

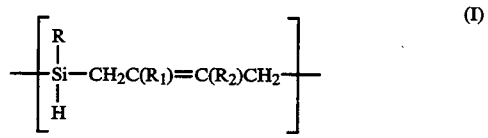
(I)

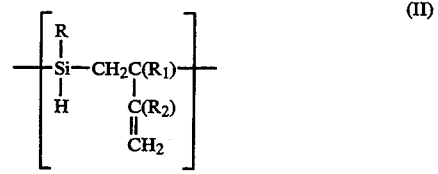
(II)

in which formulae, independently in each formula, R is as defined above; and $R_1$ and $R_2$ are, independently, H, an aliphatic or aromatic radical, preferably a methyl radical, or halogen, preferably chlorine.

It will be noted that repeating units of structure (I) and (II) arise depending on the manner in which the butadiene reacts and are both present in the polymer in varying proportions. The substituents present in the polymer depend on the substitution, if any, of the butadiene reactant(s). Polymers of the invention comprise at least 5, and preferably between 5 and 20,000 repeating units.

The polymer may also contain repeating units which do not contain silicon hydride radicals, by including disubstituted dichlorosilane reactants of the formula $(R)_2SiCl_2$, wherein each R is, independently, lower alkyl, preferably $C_1$–$C_4$ alkyl, an aromatic radical, preferably phenyl, or a cycloalkyl radical, preferably cyclohexane, in the reaction mixture. Dimethyldichlorosilane, diphenyldichlorosilane and phenylmethyldichlorosilane are illustrative of preferred reactants. The reaction mixture may contain one or more silane reactants having a silicon hydride radical of the formula $RSiHCl_2$ and also one or more silane reactants which does not have a silicon hydride radical of the formula $(R)_2SiCl_2$, in various proportions. For example, dimethyldichlorosilane and methyldichlorosilane can be reacted, in various relative proportions, with butadiene reactants in the presence of reducing metals as described above. The level of silicon hydride radicals in the product controls the level of crosslinking which can be attained when the product is subjected to crosslinking, such as hydrosilation. When the polymer is prepared in the presence of disubstituted dichlorosilane reactants, the product additionally contains at least some or up to a major proportion of repeating units of the formulae III and IV as follows:

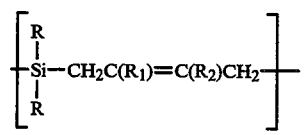

(III)

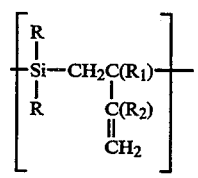

(IV)

wherein R, $R_1$ and $R_2$ are as previously defined.

The polymers of the invention, comprising the repeating units I and II which contain reactive silicon hydride, and which may also contain repeating units III and IV which do not contain reactive silicon hydride, may also be made to contain non-silicon, butadiene-derived repeating units by increasing the amount of butadiene or substituted butadiene used in the reaction relative to the amount of dichlorosilane reactant. The non-silicon, butadiene-derived units have the structures V and VI as shown below, depending on how the butadiene reacts:

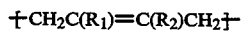 (V)

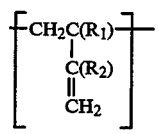

(VI)

wherein $R_1$ and $R_2$ are as previously defined.

For example, if butadiene reactant is reacted with dichlorosilane reactant at a molar ratio of 2:1, the non-silicon, butadiene derived units (V) and (VI) are present in the polymer product at about equal amounts to the silicon-containing silapentene units (I)–(IV). Increasing the amount of butadiene reactant results in non-silicon, butadiene-derived segments being positioned adjacently in the polymer chain.

The polymers of the invention can be formulated with hydrosilation catalysts to make crosslinked formulations. Preferably, the equivalent ratio of double bonds to silicon hydride groups or silicon groups in the carbosilane copolymers is 1.0/1.0 to 2.5/1.0 to achieve the preferred level of crosslinking. The hydrosilation catalyst is typically a soluble platinum or Group VIII metal complex as described in Advances in Organometallic Chemistry, Vol. 17, pg. 407. The metal is added at a concentration of 0.05% to 0.0005% by weight of the total formulation. Preferred levels for soluble $Pt^{II}$ complexes are 0.0005% to 0.005% of the crosslinked formulation. Depending upon the particular formulation the material can be coated on substrates and cured at room temperature or higher temperatures up to 280° C. (under inert atmosphere). The modulus and glass transition temperatures will vary considerably with the cure temperature. The crosslinking formulations may also contain other types of crosslinking agents in addition to the hydrosilation catalyst, such as polyenes, polycyclic polyenes, or dienes. Materials of this type are shown in, for example, U.S. Pat. Nos. 4,900,779; 4,902,731; 5,147,945; 5,124,423; 5,124,375; 5,013,375; 5,013,809; 5,008,360; 5,068,303; and 4,877,820.

The crosslinking capacity of the polymers of the invention can be further enhanced by including vinyldichlorosilanes of the formula

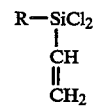

as a portion of the dichlorosilane reactant. This incorporates vinylsilane segments having the following formulae VII and VII into the polymer product:

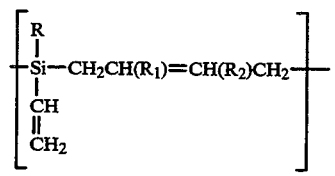

(VII)

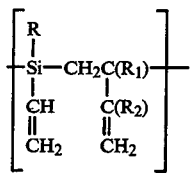

(VIII)

in which, independently in each formulae, R is as defined above, or is a vinyl radical, and is preferably methyl; and $R_1$ and $R_2$ are as defined above. The pendant vinyl groups can be crosslinked by free radicals, such as peroxide.

The polymers of this invention can be coated, molded, or compounded to make useful fabricated forms. Coating inorganic, glass, or metal under ambient conditions can provide corrosion protection for costly assemblies. The low polarity polymers provide cohesive and adhesive coatings with very low propensity for the absorption of atmospheric moisture. Low water absorption and low dielectric constants make them excellent protective coatings for sensitive electronic parts.

The polymers of this invention may be coated onto fibers to make composite laminates and fabricated into useful structures. The crosslinkable polymer formulations will coat glass, Kevlar ®, aramide fibers or carbon fibers as filaments, mats or cloth and can be partially cured to provide forms which are easily processed into laminates or other composite forms. One of the more interesting forms is printed circuit board substrates made from the low polarity polymer matrix provided by this invention.

Another application of the crosslinkable polymer formulations of this invention is to inject them into a die or mold to provide rimtruded or molded parts directly. Typically, glass non-woven mats or cloth is placed in the mold and the polymer formulation is injected to fill the mold and cured in place to make the finished molded part. In the rimtrusion applications glass or fiber roving is pulled through a die where the polymer formulation is injected under pressure and cured thermally to make a rigid rod. Rods, beams or other composite constructions can be made continuously by this process.

A number of additives can be incorporated into the polymers of this invention. Additives such as fillers, reinforcements, and pigments are readily incorporated. Carbon black, graphite fibers, Kevlar ® aramide fibers, vermiculite, diamond, mica, wollastonite, calcium carbonate, alumina, aluminosilicates, silica, fused silica, fumed silica, silicon carbide, glass spheres, glass beads, glass cloth, ground glass, and waste glass are examples of fillers which can be incorporated. Fillers serve either as reinforcement or as fillers and extenders to reduce the cost of the molded product. Glass spheres are useful for preparing low density composites. Especially useful reinforcing fillers are spherical particles of fused silica which can be included up to about 95 wt. % to decrease the thermal expansion of the crosslinked copolymer formulation. Heat conducting ceramic fillers can be used up to about 95 wt. %. These are useful in electronic encapsulants to remove heat from electronic devices. The discussion on fillers in "Transfer Molding Compounds for Encapsulants", Research Disclosure, 34139, September 1992, pp. 707-709, is incorporated by reference.

Relatively non-reactive elastomer and thermoplastic polymers may be added to form separate, discrete phases, which toughen the compositions of the invention, as disclosed in "Organosilicon Compositions Containing Hydrocarbon Elastomers", Research Disclosure, 33082, October 1991, pp. 799-800.

Stabilizers (antioxidants, antiozonants, thermal and light stabilizers) are useful to maintain the storage stability of the polymers, and the thermal oxidative stability of the final products. Among the preferred stabilizers are radical scavengers such as hindered phenols in combination with other stabilizers. Especially useful are the Tinuvin ® stabilizers available from Ciba-Geigy and the Naugard TM stabilizers from Uniroyal Chemical.

The following examples are presented to demonstrate this invention. They are not intended to be limiting. Therein, all percentages, and parts, are by weight unless otherwise indicated.

EXAMPLES

In the following examples $^1H$, $^{13}C$ NMR spectra were obtained on an IBM Bruker spectrometer operating in the FT mode. $^{29}Si$ NMR were run on an IBM-Bruker WP-270-SY spectrometer. Solutions of 5-10%(w/v) of polymer in chloroform-d were used to determine $^1H$ NMR spectra, whereas 15-25% solutions were utilized to obtain $^{13}C$ and $^{19}Si$ NMR spectra. Chloroform was used as internal standard for $^1H$ and $^{13}C$ spectra. $^{29}Si$ NMR spectra were externally referenced to TMS. IR spectra were recorded on an IBM FT-IR spectrometer of neat films between NaCl plates.

The molecular weight distribution of polymers was determined by gel permeation chromatography on a Waters system. This was comprised of a U6K injector, a 510 HPLC solvent delivery system, an R410 differential refractometer, and a Maxima 820 control system. A Waters 7.8 mm×30 cm Ultrastyragel linear column packed with <10-μm particles of mixed pore size maintained at 20° C. was used for analysis. The eluding solvent was HPLC grade THF at a flow rate of 0.7 ml/min. Retention times were calibrated against known monodisperse polystyrene standards: 612 000, 114 000, 47 500, 18 700, and 5120 whose $M_w/M_n$ are less than 1.09.

All reactions were carried out under an atmosphere of nitrogen in flame-dried glassware. Tetrahydrofuran (THF) and diethyl ether ($Et_2O$) were distilled immediately prior to use from a deep blue solution of sodium benzophenone ketyl.

EXAMPLE 1

One-Step Procedure

In a 2000 mL three-neck rb-flask equipped with a Teflon covered magnetic stirring bar and an efficient reflux condenser was placed magnesium-powder (32g, 1.32mol), methyldichlorosilane (115g, 1mol), iodine (1.0g), and anhydrous THF (800 mL). 1,3-butadiene (62g, 1.15mol) was condensed at −78° C. and then transferred to the reaction flask via a cannula. The reaction was exothermic and required external cooling. The resulting mixture was stirred for 24 h at room temperature, large amounts of salts were present. The reaction was heated at 50° C. for 2 h and then stood overnight at room temperature. The reaction mixture was cooled to 0° C. and filtered through a Buchner funnel lined with filter paper connected to a suction flask. The salts were washed with ether (2×150 mL). The combined organic layer was washed with saturated aqueous NH4Cl and then dried over anhydrous MgSO4 and filtered. The combined organic layer was directly distilled through a 35 cm vacuum jacketed column. 1-Methyl-1-silacyclopent-3-ene (16 g, 16.3% yield, bp 89° C./760 mm) was obtained after removal of solvent and unreacted starting materials. A second fraction (bp 86° C./7 mm) afforded 7 g (7.3% yield) of cyclic dimers. The residue was dissolved in a minimum amount of THF, and the polymer was precipitated from methanol. In this way, 57 g (60% yield) of the unsaturated carbosilane polymer was obtained. The molecular weight distribution of the product was $M_w/M_n$ 4000/2000 and the ratio of $Si/1,4-C_4H_6/1,2-C_4H_6$ in the polymer chain was 90/47/45 by NMR analyses.

EXAMPLE 2

Synthesis of Polymer Two-Step Procedure

A 500 mL three-neck rb-flask was equipped with a Teflon covered magnetic stirring bar and an efficient reflex condenser which was connected to a −20° C. refrigeration unit. A thermometer was placed into the reaction solution through a thermometer adapter. Magnesium-powder (0.12 mol), a catalytic amount of iodine (0.3 g) or iodomethane (0.5 mL) and fresh distilled anhydrous THF(150 mL) were added. The 1,3-butadiene (0.12–0.25 mol) was condensed at −78° C. and was then dried over active 4 A° molecular sieves. The 1,3-butadiene was then transferred to the reaction flask via a cannula. The resulting mixture was stirred for 15–48 h at 50°–70° C. depending on the initial ratio of starting materials. The reaction mixture was cooled to 0° C. and methyldichlorosilane (0.1 mol) was slowly added to the reaction mixture. The reaction was quite exothermic. The contents of the flask were maintained below 0° C. by external cooling. The reaction was stirred for 12 h at room temperature and then was heated at 50° C. for 2 h. The reaction mixture was filtered through a Buchner funnel lined with filter paper which was connected to a (water aspirator) vacuum. There were very little precipitates (most is the unreacted magnesium). The filtered solution was slowly added to an ice cooled saturated aqueous NH4Cl solution (80 mL). The aqueous layer was extracted with Et2O (50 mL×3). The combined organic phase was washed with saturated aqueous NaCl and dried over anhydrous MgSO4. After filtration and removal of solvent monomer, dimer and other volatile materials under reduced pressure (1 to 2 mmHg), the crude carbosilane polymer was obtained at 80% yield. The crude polymer was purified twice by precipitation from methanol at 70% yield. Most of low molecular oligomeric material remains in solution. The purified carbosilane polymer had $M_w/M_n = 1800/1300$; Tg=−81.2° C.

EXAMPLE 3

The procedure in example 2 was used to produce a polymer from phenyl-dichlorosilane and butadiene. The reaction of phenyldichlorosilane (30 g, 0.17 mole), 1,3-butadiene (28 g., 0.46 mole) and magnesium (5.7 g, 0.24 mole) gave 28.5 g (85% yield) of the polymer. $M_w/M_n$ 1927/1140, Tg −50.6° C.

EXAMPLE 4

The procedure in example 1 was used to prepare a polymer from 19.4 g (0.15 mole) dimethyldichlorosilane, 17.2 g (0.15 mole) methyldichlorosilane, 21.6 g (0.40 mole) butadiene, and 8.6 g (0.36 mole) magnesium.

The yield of the desired polymer was 15 g (76% yield). $M_w/M_n$ 2088/1640; $Si/C_4H_6=1/1$; Tg=−85° C.

EXAMPLE 5

The procedure in Example 2 was used to prepare a polymer from 20.2 g (0.20 mole) dichlorosilane, 27 g (0.50 mole) 1,3-butadiene and 6 g (0.25 mole) magnesium. The yield of the polymer was 20.8 g (73% yield). $M_w/M_n=28455/12590$; Tg=−85° C.

EXAMPLE 6

The procedure from example 2 was used to prepare a polymer from 19.4 g (0.15 mole) dimethyldichlorosilane, 18.4 g (0.34 mole) 1,3-butadiene, and 4.0 g (0.17 mole) magnesium. The yield of the copolymer was 19.2 g (83% yield). $M_w/M_n=21188/14243$; Tg=−95° C. Although this polymer contains no silicon hydride, the polymer could be crosslinked by free radicals, such as peroxides.

EXAMPLE 7

This example demonstrates the crosslinking of a methyldichlorosilane, butadiene copolymer. The copolymer was prepared by the procedure in Example 1 and the $Si/C_4H_6$ was 1:1. Platinum catalyst 10.05 g diluted PCO 72 (0.3518% Pt, Huls America) was added to 1.77 g of methyldichlorosilane butadiene copolymer (1/1) and the mixture was coated on the sensor of a Dupont Dielectric Analyzer. After curing at 110° C., 4 hrs; 160° C., 2 hr; and 200° C., 1 hr the dielectric constant of the crosslinked polymer was 2.15 and the dissipation factor was 0.0003 at 1 KHz.

What is claimed is:

1. A crosslinkable carbosilane polymer prepared by reacting 1,3-butadiene or substituted 1,3-butadiene or mixtures thereof with at least one dichlorosilane reactant in the presence of a reducing metal in an organic solvent and isolating the polymer from the reaction, the polymer containing repeating units of both formula (I) and formula (II)

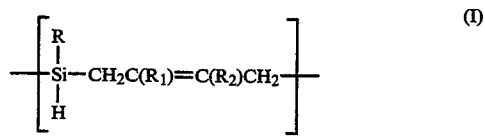

(I)

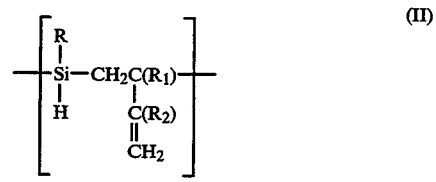

(II)

in which formulae, independently in each formula, R is hydrogen, lower alkyl, an aromatic radical, or a cyclohexyl radical; and R1 and R2 are, independently, H, and aliphatic or aromatic radical or halogen.

2. A crosslinkable carbosilane polymer as claimed in claim 1 comprising repeating units having reactive silicon hydride groups of formulae (I) and (II) and additionally comprising carbosilane repeating units which do not contain silicon hydride groups.

3. The crosslinkable carbosilane polymer as claimed in claim 1 additionally comprising non-silicon, butadiene-derived repeating units.

4. The crosslinkable carbosilane polymer as claimed in claim 1 additionally comprising vinylsilane repeating units.

5. The crosslinkable carbosilane polymer as claimed in claim 1, prepared by reacting 1,3-butadiene with methyldichlorosilane, phenyldichlorosilane, or mixtures thereof.

6. The crosslinkable carbosilane polymer as claimed in claim 1, prepared by reacting 1,3-butadiene with methyldichlorosilane and dimethyldichlorosilane.

7. The crosslinkable carbosilane polymer as claimed in claim 2, prepared reacting 1,3-butadiene with methyldichlorosilane and methylphenyldichlorosilane.

8. The crosslinkable carbosilane polymer as claimed in claim 2, prepared by reacting 1,3-butadiene with methyldichlorosilane and diphenyldichlorosilane.

9. The crosslinkable carbosilane polymer as claimed in claim 1, wherein the reducing metal is magnesium.

10. The crosslinkable carbosilane polymer as claimed in claim 1, wherein the reducing metal is sodium.

11. A crosslinkable formulation comprising the crosslinkable carbosilane polymer as claimed in claim 1 and a hydrosilation catalyst.

12. The crosslinkable carbosilane polymer as claimed in claim 1 wherein R is hydrogen, a $C_1$ to $C_4$ alkyl, phenyl or cyclohexyl; and $R_1$ and $R_2$ are independently hydrogen, a methyl radical, or chlorine.

* * * * *